United States Patent
Murayama et al.

(10) Patent No.: US 7,432,650 B2
(45) Date of Patent: Oct. 7, 2008

(54) EL DISPLAY AND PRODUCTION METHOD THEREOF

(75) Inventors: Koji Murayama, Shiga (JP); Takatoshi Tsujimura, Fujisawa (JP)

(73) Assignee: Chi Mei Optoelectronics Corp. (TW)

(*) Notice: Subject to any disclaimer, the term of this patent is extended or adjusted under 35 U.S.C. 154(b) by 203 days.

(21) Appl. No.: 11/154,409

(22) Filed: Jun. 16, 2005

(65) Prior Publication Data
US 2005/0280356 A1 Dec. 22, 2005

(30) Foreign Application Priority Data
Jun. 21, 2004 (JP) ............... 2004-182107

(51) Int. Cl.
H01J 1/62 (2006.01)
H01J 63/04 (2006.01)

(52) U.S. Cl. .................. 313/506; 313/498; 313/504; 313/512

(58) Field of Classification Search ............ 313/498, 313/500, 504, 506, 512
See application file for complete search history.

(56) References Cited

U.S. PATENT DOCUMENTS

| | | | |
|---|---|---|---|
| 6,980,272 B1 * | 12/2005 | Matthies | 349/139 |
| 2003/0127974 A1 * | 7/2003 | Miyazawa | 313/504 |
| 2003/0206332 A1 * | 11/2003 | Yamazaki et al. | 359/312 |
| 2004/0051444 A1 * | 3/2004 | Schaepkens et al. | 313/504 |
| 2004/0150332 A1 * | 8/2004 | Hwang et al. | 313/512 |
| 2004/0201048 A1 * | 10/2004 | Seki et al. | 257/294 |
| 2005/0082966 A1 * | 4/2005 | Yamazaki et al. | 313/498 |
| 2005/0236983 A1 * | 10/2005 | Sakai et al. | 313/506 |

OTHER PUBLICATIONS http://www.lib.umich.edu/dentlib/Dental_ tables/Contangle.html; 1996.*
http://www.boedeker.com/kapton_ p.htm; 2007.*
http://www.lenntech.com/teflon.htm; 1998.*
"All About Organic EL", by Junji Kido, published by Nippon Jitsugyo Publishing Co., Ltd., Feb. 20. 2003, pp. 82-85.

* cited by examiner

*Primary Examiner*—Joseph L. Williams
*Assistant Examiner*—Kevin Quarterman
(74) *Attorney, Agent, or Firm*—Milde & Hoffberg, LLP

(57) ABSTRACT

An EL display (10*a*) of the invention includes a substrate (12), a wall (14) arranged on the substrate (12) to form a plurality of openings corresponding to pixel areas, a plurality of pixel patterns (16) formed in the openings and a first lubrication layer (18*a*) formed on the wall (14).

4 Claims, 2 Drawing Sheets

PRIOR ART

EL DISPLAY AND PRODUCTION METHOD THEREOF

BACKGROUND OF THE INVENTION

1. Field of the Invention

The present invention relates to an EL (Electroluminescence) display and a method of production thereof.

2. Description of Related Art

In recent years, attention has been given to an OLED (Organic Light Emitting Device) ("All About Organic EL", by Junji Kido, published by Nippon Jitsugyo Publishing Co., Ltd., Feb. 20, 2003). The OLED is now used as a display of various products including mobile phones and digital cameras.

In applications of the well-known OLED to a full-color display, three main methods are available: (1) whole-surface white OLED and color filters, (2) whole-surface blue OLED and CCM (Color Changing Media), and (3) cells formed separately for R (Red), G (Green) and B (Blue). The RGB separate forming method, which has the highest emission efficiency and realizes a display high in color purity, has most advanced.

The RGB separate forming method includes a shadow mask method in which the cells are formed separately by evaporation using a metal mask (hereinafter, referred to as "mask") 20 shown in FIG. 4 ("All About Organic EL", by Junji Kido, published by Nippon Jitsugyo Publishing Co., Ltd., Feb. 20, 2003). Before the cells are separately formed, alignment marks on the mask 20 and a substrate 11 are measured with a CCD (Charge Coupled Device) camera, the shift of the mask 20 from the relative position is calculated by a computer, and the mask 20 is moved in accordance with the result of calculation. This is an alignment process. Normally, one alignment operation cannot produce a sufficiently high accuracy, and therefore several alignment operations are conducted. Thus, the process of attaching the mask 20 and a wall 14 closely to each other by a magnet and separating them from each other is repeated. As shown in FIG. 4, the mask 20 is set in position with respect to the substrate 11 in such a manner that all the pixel areas are open through holes 22 of the mask 20 at the time of evaporation.

In setting the mask 20 in position with respect to the substrate 11, as described above, the mask 20 closely attached to the wall 14 is separated from the wall 14 in some cases. In this process, the mask 20 and the wall 14 on the substrate 11 interfere with each other in some cases, and the mask 20 is caught by the wall 14 of the substrate 11, so that the wall 14 of the substrate 11 is scratched or the mask 20 itself is damaged in some cases. This is because the wall 14 in contact with the mask 20 is made of polymer; therefore, the contact angle of the polymer with water is so small as at several degrees to several tens of degrees and the wettability thereof is high. As another reason, in the case where the wall is formed of polymer not small in contact angle with water, the wettability of the wall is probably improved by oxygen plasma treatment or UV ozone treatment performed to clean an anode surface. Herein, the polymer making up the wall is a photosensitive negative resist.

Once the wall is scratched as described above, the display performance of the EL display is probably reduced. Also, the mask, if damaged, is required to be replaced, which consumes time and reduces the productivity while at the same time increasing the production cost of the EL display.

Once the wall is scratched as described above, the display performance of the EL display 10c is usually reduced. Also, the mask, if damaged, is required to be replaced, which consumes time and reduces the productivity while at the same time increasing the production cost of the EL display.

This invention has been achieved in view of the problems described above, and an object thereof is to prevent the wall from being scratched by the mask deposited by evaporation and also to prevent the mask from being damaged.

SUMMARY OF THE INVENTION

According to one aspect of the invention, there is provided an EL display comprising a substrate, a wall arranged on the substrate to form a plurality of openings, a plurality of pixel patterns formed in the openings, and a first lubrication layer formed on the wall.

According to another aspect of the invention, there is provided a method of producing an EL display, comprising the steps of preparing a display substrate having a substrate, a wall arranged on the substrate to form a plurality of openings and a first lubrication layer formed on the wall, arranging a mask having a plurality of holes corresponding to the openings in contact with the first lubrication layer on the display substrate, and evaporating an evaporation source arranged outside the mask while depositing evaporated substance from the evaporation source on the display substrate in the openings through the holes of the mask.

According to still another aspect of the invention, there is provided a method of producing an EL display, comprising the steps of preparing a display substrate having a substrate, and a wall arranged on the substrate to form a plurality of openings, preparing a mask having a third lubrication layer on at least a main surface of a tabular member having a plurality of holes corresponding to the openings, arranging the mask on the display substrate in such a manner that the third lubrication layer is in contact with the wall, and evaporating an evaporation source arranged outside the mask while depositing evaporated substance from the evaporation source in the openings through the holes of the mask.

According to still another aspect of the invention, there is provided a method of producing an EL display, comprising the steps of preparing a display substrate having a substrate, and a wall arranged on the substrate to form a plurality of openings, preparing a mask having a third lubrication layer on at least a main surface of a tabular member having a plurality of holes corresponding to the openings, arranging the mask on the display substrate in such a manner that the third lubrication layer is in contact with the wall, and evaporating an evaporation source arranged outside the mask while depositing the evaporated substance from the evaporation source in the openings through the holes of the mask.

BRIEF DESCRIPTION OF THE DRAWINGS

FIGS. 2(a) to 2(c) show a method of producing an EL display according to the invention, in which FIG. 2(a) is a diagram for explaining a step of preparing a display substrate, FIG. 2(b) is a diagram for explaining a step of forming a first lubrication layer and a second lubrication layer, and FIG. 2(c) is a diagram for explaining alignment;

FIGS. 3(a) and 3(b) show another method of producing an EL display according to the invention, in which FIG. 3(a) is a diagram for explaining a step of preparing a display substrate, and FIG. 3(b) is a diagram for explaining a step of alignment using a mask having a third lubrication layer.

DESCRIPTION OF THE PREFERRED EMBODIMENTS

Embodiments of the invention is explained below with reference to the drawings. An EL display used for the explanation is an organic EL display.

Figure 1:
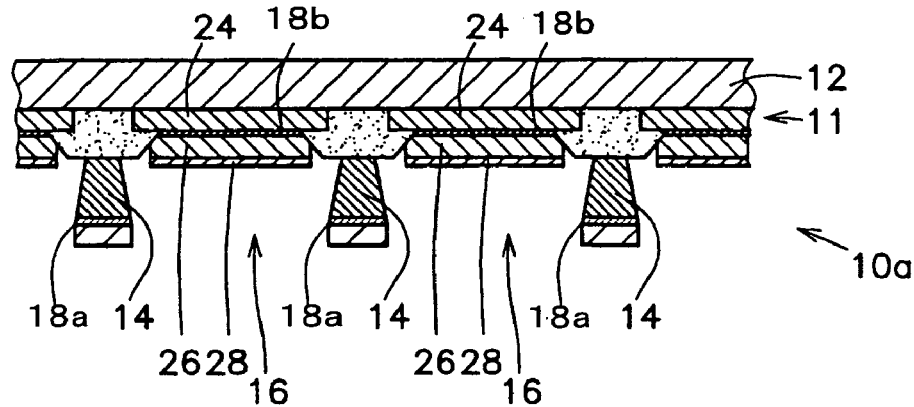
FIG. 1 is a sectional view showing an EL display according to an embodiment of the invention.

An EL display 10a according to the invention including a display substrate 11 shown in FIG. 1 comprises a substrate 12, a wall 14 arranged on the substrate 12 to form a plurality of openings, a plurality of pixel patterns 16 formed in the openings, and a first lubrication layer 18a formed on the wall 14.

The substrate 12 is transparent for the EL display of bottom emission type, and reflects light for the EL display of top emission type.

The wall 14 is formed to surround a pixel on two or four sides. The wall 14 is formed of such a material as a photosensitive negative resist. This resist has a very small contact angle of several to several tens of degrees with water. Nevertheless, a resist having a contact angle of 50 to 60 degrees with water is also used with comparative frequency. The wall 14 is connected to a plurality of walls on the display substrate 11.

The first lubrication layer 18a has preferably a smaller friction coefficient than the wall 14. The contact angle of the material making up the lubrication layer 18 with water is preferably set at 80° to 120°. The contact angle is so large that a mask 20, if used for production of the display 10a, is hardly caught at the time of evaporation. Thus, the wall 14 is not easily damaged.

The first lubrication layer 18a is formed of such a material as fluororesin, silicone resin or polyvinyl chloride. The fluororesin, if employed, is preferably composed of $CF_x$ ($1.3 \leq x \leq 2$) or $CH_xF_y$ ($0 < x \leq 1$, $1 \leq y \leq 2$, $1.3 \leq x+y \leq 2$). The $CF_x$ or $CH_xF_y$ film has the properties similar to polytetrafluoroethylene.

Each pixel pattern 16 includes at least an organic layer 26, an anode 24 and a cathode 28 sandwiching the organic layer 26, and a wiring pattern and a switching element for supplying a current to the anode 24.

The organic layer 26 includes a light emitting layer formed of an organic material such as $Alq_3$, anthracene, $Znq_2$, $Balq_2$, $Almq_3$, $Tb(acac)_3$, DCJTB, C545T, perylene, quinacridone derivative, rubren or rhodamine, which emits light at a predetermined wavelength upon electrical conduction thereof. This organic layer 26 emits light for display at a predetermined brightness by the energy released at the time of recombination of holes and electrons in the light emitting layer.

In the EL display 10a according to the invention, the first lubrication layer 18a is arranged on the wall 14, and the latter is therefore not easily scratched at the time of production. Thus, a satisfactory display is realized.

Next, a method of producing the EL display 10a is explained.

Figure 2A:
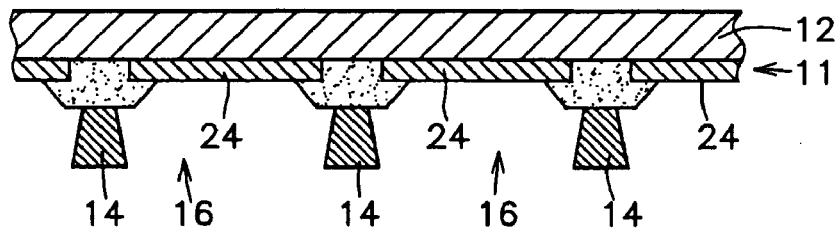

(1) First, as shown in FIG. 2(a), a display substrate 11 having a substrate 12 and a wall 14 arranged on the substrate 12 to form a plurality of openings corresponding to pixel areas is prepared.

Anodes 24 made of ITO, for example, are formed in such a manner that ITO of a predetermined thickness is formed by a well-known thin film forming technique, or specifically, by evaporation or sputtering, and the film thus formed is processed to a predetermined pattern by using the technique of photolithography or etching. The wall 14 is formed in such a manner that a photosensitive photoresist (such as novolac resin or epoxy resin) is coated in a predetermined thickness on the substrate by the spin coat method or the like and, also, is sensitized into a predetermined pattern, and the unnecessary portions are removed by chemical etching.

Figure 2B:
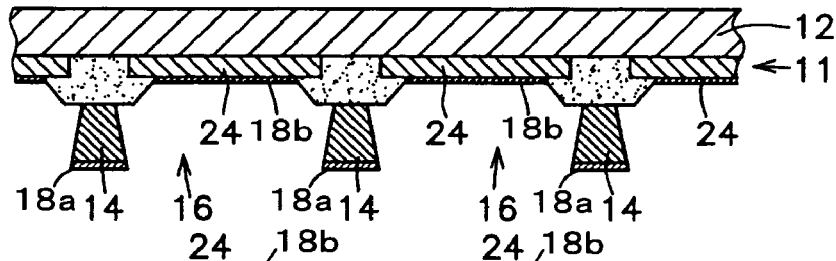

(2) Next, as shown in FIG. 2(b), a first lubrication layer 18a and a second lubrication layer 18b are formed on the wall 14 and the anodes 24, respectively. The first lubrication layer 18a and the second lubrication layer 18b made of fluororesin, for example, are formed in such a manner that a high vacuum plasma (pressure of 0.05 to 0.3 Pa) is generated in a fluorocarbon gas atmosphere thereby to deposit the gas in the atmosphere on the wall 14 and the anodes 24. In the process, the surface of each anode 24 is cleaned while the work function thereof increases. Also, the second lubrication layer 18b formed on the anodes 24 has a lower hole injection (movement) barrier with respect to the organic layer due to the improved work function on the surface of the anodes 24, and therefore holes can be more easily injected into the organic layer formed later.

Figure 2C:
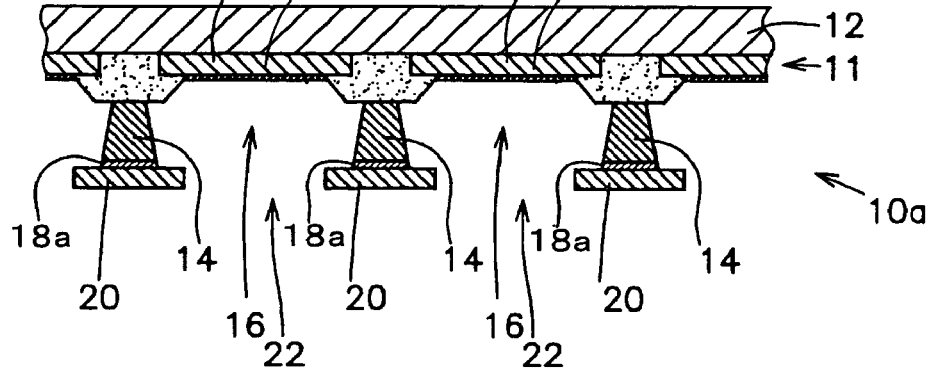

(3) Then, as shown in FIG. 2(c), a mask 20 having holes 22 corresponding to the openings is prepared. The mask 20 is brought into contact with the first lubrication layer 18a on the wall 14 and arranged on the display substrate 11.

The mask 20 and the wall 14 are brought into contact with each other in such a manner that a magnet is arranged on the surface of the display substrate 11 opposite to the wall 14, and the mask 20 is attached closely to the lubrication layer 18 on the wall 14 by the magnetic force of the magnet. Incidentally, in the case where the mask 20 is fixed in position by the magnetic force of the magnet in this way, the mask 20 is formed of a magnetic material such as a Ni alloy, a Ni-Co alloy, a Fe-Ni-Co alloy or the like.

The display substrate 11 and the mask 20 are aligned with each other in such a manner that the alignment marks formed on the display substrate 11 and the mask 20 are imaged by a CCD camera and the shift between the display substrate 11 and the mask 20 is calculated from the relative distance thereof, and the mask 20 is moved by the calculated distance. Normally, a single alignment process fails to produce a sufficiently high accuracy and the alignment process is repeated several times. At the same time, the first lubrication layer 18a can successfully prevent the wall 14 and the mask 20 from being caught by each other, so that the display substrate 11 is not scratched or the mask 20 is not damaged.

(4) The evaporation is carried out using the mask 20. Specifically, the evaporation source arranged above the mask 20 on the display substrate 11 is evaporated. Evaporated substance is deposited on the display substrate 11 in the openings through the holes 22 of the mask 20 thereby to form the pixel patterns 16. The evaporated substance is an organic material making up the organic layer and a metal material (such as Ca, Mg, LiF/Al, AlLi, etc.) making up the cathode. At the same time, a protective film of an inorganic material such as SiN or SiO may be formed to protect the cathode.

As described above, according to the invention, the provision of the first lubrication layer 18a prevents the display substrate 11 from being scratched or the mask 20 from being damaged at the time of alignment of the mask 20. Thus, the performance reduction of the EL display 10a is suppressed.

The configuration in which the EL display 10a includes the first lubrication layer 18a is described above. The lubrication layer, however, may be formed on the mask instead of on the EL display with equal effect. The method of production with such a configuration is explained below.

Figure 3A:
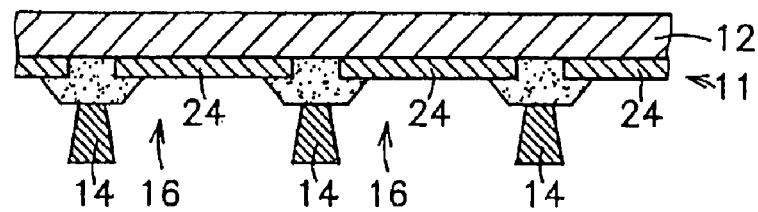

(1) As shown in FIG. 3(a), a display substrate 11 including a substrate 12 and a wall 14 forming a plurality of openings corresponding to pixel areas arranged on the substrate 12 is prepared. Except for the lack of the first lubrication layer 18a on the display substrate 11, the method of producing the display substrate 11 is the same as the one described above and therefore is not described.

Figure 3B:
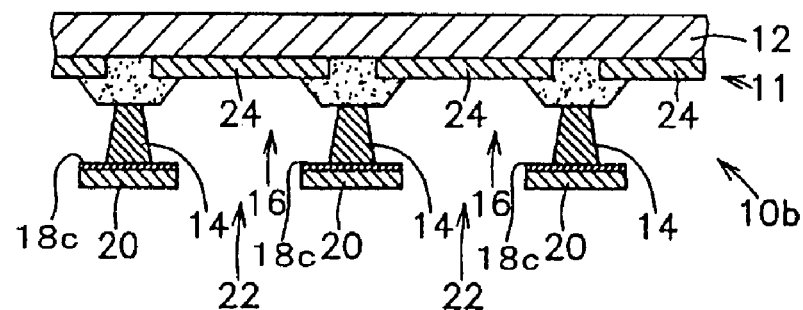
Figure 4:
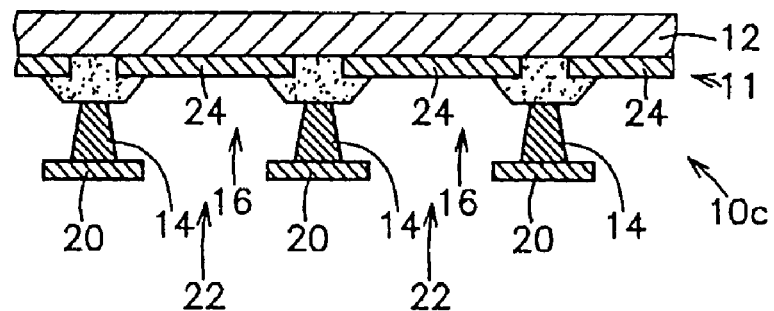
FIG. 4 is a diagram for explaining a conventional method of producing an EL display in which a display substrate and a mask are aligned with each other.

(2) As shown in FIG. 3(b), a mask 20 having holes 22 corresponding to the openings and a third lubrication layer 18c formed on at least a main surface of the mask 20 is prepared. This mask 20 is arranged on the display substrate 11 in such a manner that the third lubrication layer 18c is in contact with the wall 14.

The third lubrication layer 18c on the mask 20 is formed in the same way as it is formed on the wall 14 or the anode 24. The mask 20 and the display substrate 11 are brought into contact with each other by arranging a magnet on the surface of the display substrate 11 opposite to the wall 14 and attaching the mask 20 closely to the wall 14 by the magnetic force of the magnet.

The mask 20 and the display substrate 11 are aligned with each other in the same way as described above although the mask 20 includes the third lubrication layer 18c. The configuration of the third lubrication layer 18c on the mask 20 is similar to that of the first lubrication layer 18a formed on the wall 14. Since the third lubrication layer 18c is formed on the mask 20, as in the way described above, the mask 20 and the wall 14 are hardly caught by each other. Thus, it is possible to prevent the display substrate 11 from being scratched or the mask 20 from being damaged.

(3) An evaporation source arranged outside the mask 20 is evaporated, and evaporated substance is deposited in the openings through the holes 22 of the mask 20 thereby to form a plurality of pixel patterns 16. Each pixel pattern 16 includes an organic layer and a cathode. Once the organic layer emits light, the display is made possible.

According to this embodiment, the provision of the third lubrication layer 18c on the mask 20 makes it difficult for the mask 20 and the wall 14 to be caught by each other and therefore the display substrate 11 is successfully prevented from being scratched. As a result, the EL display 10b can be maintained at a high display performance. Also, the damage to the mask 20 is suppressed, so that the mask 20 is required to be changed less frequently for an improved productivity and a lower production cost.

Unlike in the aforementioned embodiments in which the first lubrication layer 18a or the third lubrication layer 18c is formed on the display substrate 11 or the mask 20, the first lubrication layer 18a and the third lubrication layer 18c may alternatively be formed on the display substrate 11 and the mask 20, respectively.

The organic EL display with reference to which the embodiments are described above may be replaced with an inorganic EL display in which an inorganic layer emits light. The wall 14 may be separated.

Also, as long as the alignment is made using the mask 20, the production process is not limited to the vapor deposition. Further, a positive resist, instead of the negative resist used in the above-mentioned embodiments, may be used to form the wall.

According to this invention, the mask and the display substrate are caught by each other less frequently. As a result, the wall is successfully prevented from being scratched and, also, the mask itself is prevented from being damaged.

This invention can be embodied in the form variously improved, corrected or modified based on the knowledge of those skilled in the art without departing from the spirit and scope of the invention.

The present application claims priority from Japanese Patent Application No. 2004-182107, the content of which is hereby incorporated by reference.

What is claimed is:

1. An EL display with a plurality of pixels arranged, comprising:
   a substrate;
   a wall arranged on the substrate to form a plurality of openings;
   a plurality of pixel patterns formed in the openings; and
   a first lubrication layer formed directly on the wall, said first lubrication layer having a smaller friction coefficient than the wall;
   wherein each of the plurality of pixel patterns comprises a first electrode, an organic, light emitting layer on the first electrode, and a second electrode on the organic layer.

2. An EL display according to claim 1, wherein the first lubrication layer is composed of a material having a contact angle of 80° to 120° with respect to water.

3. An EL display according to claim 1, wherein the first lubrication layer is formed of silicone resin or polyvinyl chloride.

4. An EL display according to claim 1 further includes a second lubrication layer, wherein the second lubrication layer is disposed between the first electrode and the organic layer.

* * * * *

UNITED STATES PATENT AND TRADEMARK OFFICE
CERTIFICATE OF CORRECTION

PATENT NO. : 7,432,650 B2
APPLICATION NO. : 11/154409
DATED : October 7, 2008
INVENTOR(S) : Koji Murayama and Takatoshi Tsujimura It is certified that error appears in the above-identified patent and that said Letters Patent is hereby corrected as shown below:

Title page, Item (73) Assignee should read:

-- Chi Mei Optoelectronics Corp. (TW); and
    Kyocera Corporation (JP) --

Signed and Sealed this
Thirty-first Day of July, 2012

David J. Kappos
*Director of the United States Patent and Trademark Office*